United States Patent
Shusterman et al.

(10) Patent No.: US 10,903,114 B2
(45) Date of Patent: *Jan. 26, 2021

(54) DECOUPLED VIA FILL (71) Applicant: Intel Corporation, Santa Clara, CA (US)

(72) Inventors: Yuriy V. Shusterman, Portland, OR (US); Flavio Griggio, Portland, OR (US); Tejaswi K. Indukuri, Portland, OR (US); Ruth A. Brain, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/582,923

(22) Filed: Sep. 25, 2019

(65) Prior Publication Data
US 2020/0090992 A1   Mar. 19, 2020

Related U.S. Application Data (63) Continuation of application No. 16/249,593, filed on Jan. 16, 2019, now Pat. No. 10,468,298, which is a
(Continued)

(51) Int. Cl.
H01L 23/48 (2006.01)
H01L 23/52 (2006.01)
(Continued)

(52) U.S. Cl.
CPC .. H01L 21/76877 (2013.01); H01L 21/32115 (2013.01); H01L 21/32133 (2013.01);
(Continued)

(58) Field of Classification Search
CPC .......... H01L 21/76807; H01L 21/7685; H01L 2221/1036; H01L 23/55226;
(Continued)

(56) References Cited

U.S. PATENT DOCUMENTS 6,380,084 B1   4/2002 Lim et al.
7,084,056 B2   8/2006 Won
(Continued)

FOREIGN PATENT DOCUMENTS

CN   1835206      9/2006
CN   101431047    5/2009
(Continued)

OTHER PUBLICATIONS

Office Action from Taiwan Patent Application No. 108141026, dated Apr. 10, 2020, 6 pages.
(Continued)

Primary Examiner — S. V. Clark
(74) Attorney, Agent, or Firm — Schwabe, Williamson & Wyatt, P.C.

(57) ABSTRACT

Techniques are disclosed for providing a decoupled via fill. Given a via trench, a first barrier layer is conformally deposited onto the bottom and sidewalls of the trench. A first metal fill is blanket deposited into the trench. The nonselective deposition is subsequently recessed so that only a portion of the trench is filled with the first metal. The previously deposited first barrier layer is removed along with the first metal, thereby re-exposing the upper sidewalls of the trench. A second barrier layer is conformally deposited onto the top of the first metal and the now re-exposed trench sidewalls. A second metal fill is blanket deposited into the remaining trench. Planarization and/or etching can be carried out as needed for subsequent processing. Thus, a methodology for filling high aspect ratio vias using a dual metal process is provided. Note, however, the first and second fill metals may be the same.

20 Claims, 7 Drawing Sheets

Related U.S. Application Data continuation of application No. 16/005,175, filed on Jun. 11, 2018, now Pat. No. 10,211,098, which is a continuation of application No. 15/528,425, filed as application No. PCT/US2014/072249 on Dec. 23, 2014, now Pat. No. 10,026,649.

(51) Int. Cl.

| | | |
|---|---|---|
| *H01L 21/768* | (2006.01) | |
| *H01L 23/532* | (2006.01) | |
| *H01L 21/321* | (2006.01) | |
| *H01L 21/3213* | (2006.01) | |
| *H01L 23/31* | (2006.01) | |
| *H01L 23/528* | (2006.01) | |

(52) U.S. Cl.
CPC .... *H01L 21/76847* (2013.01); *H01L 23/3171* (2013.01); *H01L 23/528* (2013.01); *H01L 23/53223* (2013.01); *H01L 23/53238* (2013.01); *H01L 23/53252* (2013.01); *H01L 23/53266* (2013.01)

(58) Field of Classification Search
CPC ......... H01L 21/76843; H01L 21/76877; H01L 21/76224; H01L 45/1683; H01L 21/76821
USPC ........ 257/750, 751, 758, 760, 762, 763, 765
See application file for complete search history.

(56) References Cited

U.S. PATENT DOCUMENTS

| | | | |
|---|---|---|---|
| 7,659,197 | B1 | 2/2010 | Juliano |
| 8,586,473 | B1 | 11/2013 | Tanwar |
| 10,468,298 | B2 * | 11/2019 | Shusterman ...... H01L 21/76877 |
| 2003/0134510 | A1 | 7/2003 | Lee et al. |
| 2003/0160331 | A1 | 8/2003 | Fujisawa |
| 2003/0186539 | A1 | 10/2003 | Lee |
| 2004/0065914 | A1 | 4/2004 | Koike |
| 2005/0142841 | A1 | 6/2005 | Lee |
| 2005/0142862 | A1 | 6/2005 | Chun |
| 2006/0255463 | A1 | 11/2006 | Won |
| 2007/0292604 | A1 | 12/2007 | Dordi |
| 2008/0099921 | A1 | 5/2008 | Katata |
| 2008/0157075 | A1 | 7/2008 | Feustel et al. |
| 2009/0081865 | A1 | 3/2009 | Isono |
| 2009/0294984 | A1 | 12/2009 | Zhu |
| 2011/0151661 | A1 | 6/2011 | Sunayama et al. |
| 2011/0193199 | A1 | 8/2011 | Filippi |
| 2013/0270703 | A1 | 10/2013 | Zierath et al. |
| 2015/0123279 | A1 * | 5/2015 | Chi ................... H01L 23/53252 257/751 |
| 2015/0137388 | A1 * | 5/2015 | Kim ...................... H01L 23/562 257/774 |
| 2015/0221597 | A1 * | 8/2015 | Omori ............... H01L 23/53228 257/751 |
| 2015/0340269 | A1 * | 11/2015 | Rivoire ............... H01L 25/0657 257/751 |
| 2017/0338148 | A1 | 11/2017 | Shusterman et al. |
| 2018/0019187 | A1 * | 1/2018 | Lagouge ........... H01L 21/32134 |
| 2018/0261677 | A1 * | 9/2018 | Lee ..................... H01L 27/0924 |
| 2019/0081152 | A1 * | 3/2019 | Suh ................... H01L 21/02164 |

FOREIGN PATENT DOCUMENTS

| | | |
|---|---|---|
| CN | 102347210 | 2/2012 |
| CN | 102437097 | 5/2012 |
| CN | 102437098 | 5/2012 |
| JP | H4-196526 | 7/1992 |
| KR | 1020030048220 | 6/2003 |
| KR | 1020080095654 | 10/2008 |
| KR | 1020090078106 | 7/2009 |
| WO | WO 2012087714 | 6/2012 |
| WO | WO 2016105400 | 6/2016 |

OTHER PUBLICATIONS

Office Action from Chinese Patent Application No. 201480083579.0, dated Mar. 19, 2020, 10 pages.
Search Report for European Patent Application No. 14909243.9, dated Jun. 27, 2018, 8 pages.
International Search Report and Written Opinion for International Patent Application No. PCT/US2014/072249 dated Aug. 28, 2015, 11 pages.
International Preliminary Report on Patentability for International Patent Application No. PCT/US2014/072249 dated Jun. 27, 2017, 9 pages.
Taiwan Patent Application No. 104138781, dated Mar. 12, 2019, 12 pages.
Office Action from U.S. Appl. No. 15/528,425, dated Oct. 5, 2017, 8 pages.
Office Action for European Patent Application No. 14909243.9, dated May 27, 2019, 7 pages.
Search Report for European Patent Application No. 19156148.9, dated May 28, 2019, 10 pages.
Notice of Allowance for Taiwan Patent Application No. 104138781, dated Aug. 7, 2019, 2 pages.
Office Action from Chinese Patent Application No. 201480083579.0, dated Sep. 18, 2020, 11 pages.

\* cited by examiner

DECOUPLED VIA FILL

This application is a continuation of U.S. application Ser. No. 16/249,593, filed Jan. 16, 2019, which is a continuation of U.S. application Ser. No. 16/005,175, filed Jun. 11, 2018, now U.S. Pat. No. 10,211,098 issued Feb. 19, 2019, which is a continuation of U.S. application Ser. No. 15/528,425 filed May 19, 2017 now U.S. Pat. No. 10,026,649 issued Jul. 17, 2018, which is a U.S. National Stage Application of PCT/US2014/072249 filed Dec. 23, 2014, which are herein incorporated by reference in their entirety.

BACKGROUND

In the manufacture of integrated circuits, interconnects are generally formed on a semiconductor substrate using a copper dual damascene process. Such a process typically begins with a trench and via being etched into a dielectric layer and then filled with a barrier/adhesion layer and a seed layer using a physical vapor deposition (PVD) sputtering process. An electroplating process is then used to fill the via and trench with copper metal to form the interconnect. However, as device dimensions scale down and the features become narrower, the aspect ratio of the features becomes more aggressive. The line-of-sight PVD process gives rise to issues such as trench overhang of the barrier/adhesion, and seed layers, leading to pinched-off trench and via openings during plating, and inadequate gap fill.

DETAILED DESCRIPTION

Techniques are disclosed for providing a decoupled via fill. Given a via trench, a first barrier layer is conformally deposited onto the bottom and sidewalls of the trench. Then, a first metal fill is blanket deposited into the trench. The non-selective deposition is subsequently recessed so that only a portion of the trench is filled with the first metal. The previously deposited first barrier layer is removed along with the first metal, thereby re-exposing the upper sidewalls of the trench. Then, a second barrier layer is conformally deposited onto the top of the first metal and the now exposed sidewalls of the trench. A second metal fill is blanket deposited into the remaining trench. Just as with the non-selective deposition of first metal, the non-selective deposition of second metal may provide excess metal, which can be removed with planarization and/or etching as needed. Subsequent processing can then be carried out (e.g., formation of next ILD layer, a passivation layer, or an electronic device layer, or a contact layer). As will be appreciated, the first conformal barrier prevents intermixing between the lower metal and the first fill metal. In addition, the non-selective deposition of the first metal prevents defects formed in traditional electro-less approaches. Likewise, cladding the top of the first fill metal with the second thin conformal barrier prevents intermixing between the first fill metal and the second fill metal, and further minimizes voids and offers higher EM performance. Thus, a methodology for filling high aspect ratio vias using a dual metal process is provided. Note, however, the first and second metals may also be the same, in accordance with some embodiments.

General Overview

Figure 1A:
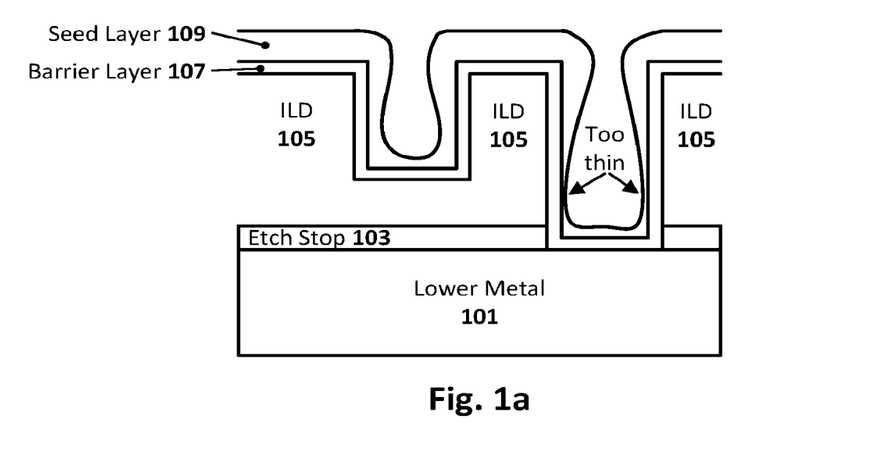
FIGS. 1a-b collectively illustrate a line-of-sight deposition process that gives rise to issues such as trench overhang of the barrier/adhesion, and seed layers, leading to pinched-off trench and via openings during plating, and inadequate gap fill.
Figure 1B:
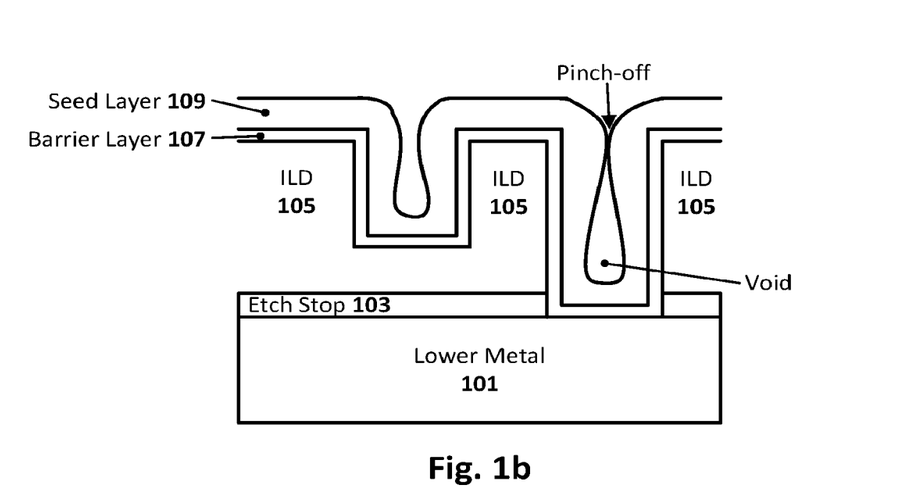
Figure 2A:
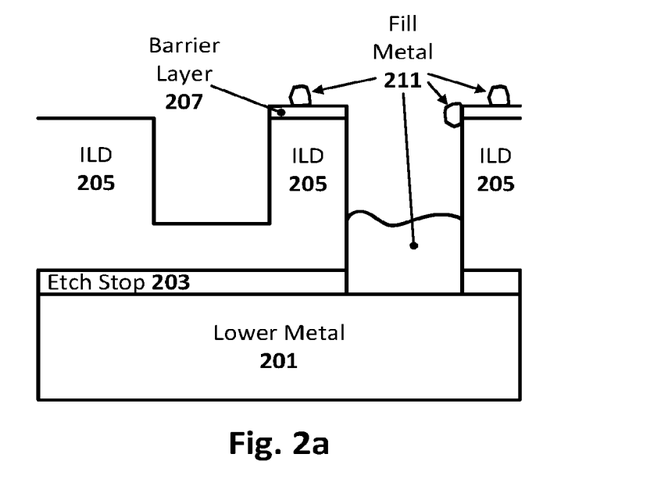
FIGS. 2a-b collectively illustrate a selective deposition process that gives rise to issues such as defects intrinsic to imperfect selectivity.
Figure 2B:
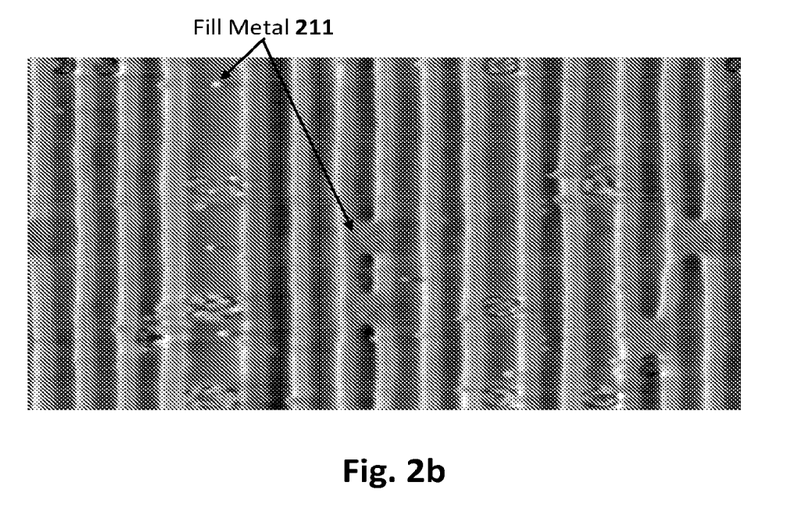

As previously explained, there are some limitations associated with traditional dual damascene interconnect processes. The traditional aspect ratio for dual damascene interconnects at the tightest metal layers is typically in the range of 1:3 to 1:6. Conventional PVD tantalum/copper (Ta/Cu) based processing is used for metallization of the trench and the via in dual damascene interconnects. Beyond the 22 nm node, patterning techniques such as pitch doubling and pitch quartering can be used to overcome the limitations of traditional 193 nm immersion lithographic schemes. Despite such advances, longstanding limitations of non-conformal deposition techniques remain with respect to gapfill ability in high aspect ratio vias and electromigration (EM) time-to-fail. For instance, FIGS. 1a-b show a typical dual damascene configuration where a via is used to conductively connect to a lower metal 101 through an etchstop layer 103. As can be seen, a non-conformal deposition technique is inadequate at delivering sufficient barrier and seed layers (107 and 109, respectively) on sidewalls of high aspect ratio vias formed in the interlayer dielectric (ILD) 105. In particular, FIG. 1a shows sidewall thickness that is too thin near the bottom of the right via which in turn causes gapfill and EM degradation, and FIG. 1b shows how using a thicker non-conformal film to overcome that sidewall weakness causes pinch-off and trapped voids. One way to avoid such undesirable results is to use electroless approaches where a metal is selectively grown based on the template metal in the underlayer to form the via. Once via fill is complete, it is possible to extend PVD metallization and/or use other chemical vapor deposition (CVD) and atomic layer deposition (ALD) options to fill the upper trench. However, a non-trivial issue associated with such selective approaches is the intermixing of the two metallurgies chosen for the trench and via metallization. In addition, defects intrinsic to imperfect selectivity of electroless approaches can be problematic. For instance, FIG. 2a shows how a via for coupling to lower metal 201 can be provided in ILD 205 using selective deposition of fill metal 211 so as to improve margin for trench only fill. However, further note the imperfect selectivity where spurious nucleation of metal 211 also occurs on the field on barrier layer 207. FIG. 2b is a top down image further demonstrating such imperfect selectivity.

Thus, and in accordance with an embodiment of the present disclosure, interconnect structures are provided that decouple via fill from the upper and lower trench metals. In particular, a relatively thin conformal physical barrier is provided to isolate the lower trench and via metallurgies to prevent intermixing. A blanket or otherwise non-selective deposition can be used to provide the metal fill for the via portion (first metal) of the interconnect, rather than selective electroless approaches. The first metal is recessed as needed to leave only the via filled by that metal, thereby leaving the upper trench unfilled. The exposed top surface of the via is then cladded with a thin conformal film to prevent intermix between the via metal fill and the upper metal line, and to increase EM performance. This conformal film further provides a barrier layer, on the sidewalls of the upper trench. A second fill metal is then provided by way of non-selective deposition to fill the upper trench. The second fill metal can then be planarized to allow for subsequent processing. Any suitable blanket deposition techniques can be used for providing the non-selective metal fills. In accordance with some embodiments, and as will be further appreciated in light of this disclosure, decoupling via metal and trench fill metals may improve gapfill margin and further allows the utilization of scaled thin conformal barriers for trench and via, thus achieving improvements in line and via resistance and therefore, RC performance.

Note that use of non-selective deposition for the fill metals further allows for elimination of defects formed in traditional electroless approaches due to spurious nucleation. In addition, the ability to use non-selective deposition further eliminates typical impurities associated with electroless chemistries, such as tungsten (W), boron (B), and phosphorus (P) which can adversely affect metal resistances. Further note that the use of the first conformal barrier also prevents intermixing of via metal with the underlayer trench metal, thus preventing void nucleation and lowering line resistance. In addition, cladding the via using a second thin conformal liner prevents intermixing of the via and the upper metal and allows minimal void nucleation and potential for superior EM performance due to shortline effect. Numerous other such benefits, as well as other configurations and embodiments, will be apparent in light of this disclosure. For instance, the first and second conformal barrier layers may further operate to reduce the risk of delamination, as the binding energy between metal and ILD materials is not particularly favorable.

System Architecture

Figure 3A:
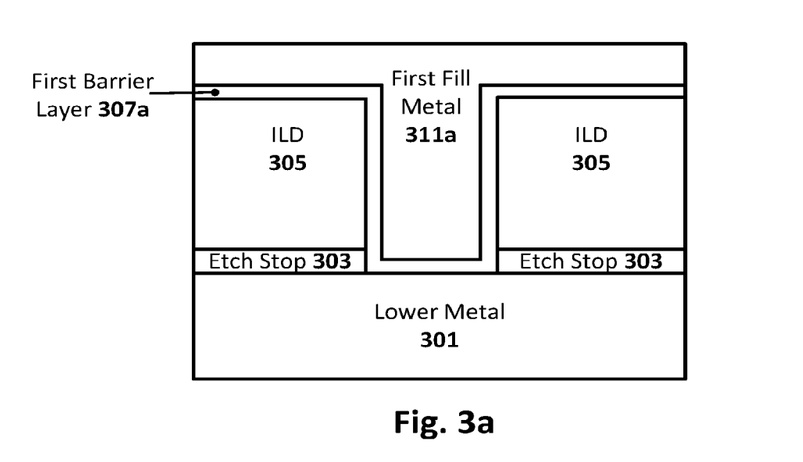
FIGS. 3a-b collectively illustrate example structures resulting from a decoupled via fill process, in accordance with an embodiment of the present disclosure.
Figure 3B:
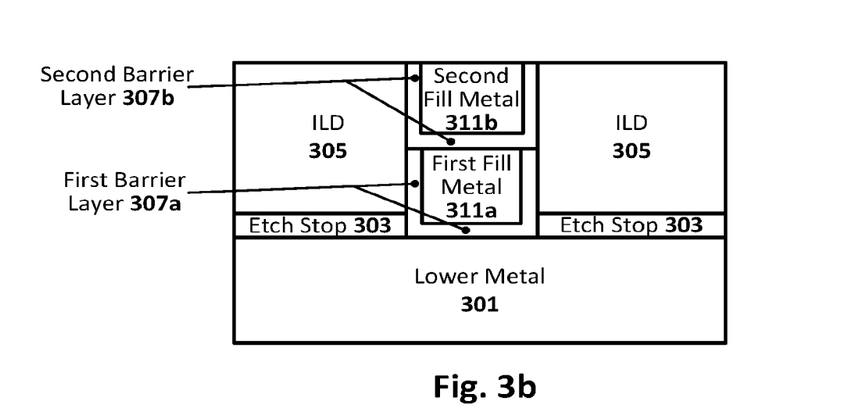

FIGS. 3a-b collectively illustrate example structures resulting from a decoupled via fill process, in accordance with an embodiment of the present disclosure. In particular, FIG. 3a shows the intermediate structure that results after a first fill metal 311a is deposited. As can be seen, the structure includes a lower metal 301 having an etch stop layer 303 deposited thereon. An interlayer dielectric (ILD) layer 305 is then provisioned on the etch stop layer 303. A trench is subsequently etched into the ILD layer 305 down to the etch stop layer, so as to allow for a conductive interconnect from some upper metal layer and the lower metal 301. In more detail, and as can be further seen in FIG. 3a, a first barrier layer 307a is conformally deposited onto the bottom and sidewalls of the trench. Then, the first metal 311a is blanket deposited into the trench.

As can be seen, the non-selective deposition provides excess metal 311a on the field outside the trench as well. As such, the first metal 311a is subsequently recessed so that only a portion of the trench is filled with the first metal 311a. Note that the previously deposited first barrier layer 307a is removed along with the first metal 311a, thereby re-exposing the upper sidewalls of the trench. Then, and as can be seen in FIG. 3b, a second barrier layer 307b is conformally deposited onto the top of the first metal 311a and the now exposed sidewalls of the trench. Then, the second metal 311b is blanket deposited into the remaining trench. Just as with the non-selective deposition of first metal 311a, the non-selective deposition of second metal 311b may provide excess metal 311a on the field outside the trench, which can be removed with planarization and/or etching as appropriate. Subsequent processing can then be carried out, which may include, for example, deposition of another etch stop layer and ILD layer, or a passivation layer, or an electronic device layer, or a contact layer, to name a few examples. As will be appreciated, numerous configurations can be implemented and the present disclosure is not intended to be limited to any particular one.

The thin conformal barrier 307a prevents intermixing between the lower metal 301 and the first metal 311a. In addition, the non-selective deposition of the first metal 311a prevents defects formed in traditional electro-less approaches. Likewise, cladding the top of metal 311a with thin conformal barrier 307b prevents intermixing between the first metal 311a and the second metal 311b, and further minimizes voids and offers higher EM performance. Thus, a methodology for filling high aspect ratio vias (e.g., 1:5 or higher) using a dual metal process is provided. Note, however, the first and second metals 311a and 311b may also be the same, in some embodiments.

Example materials that can be used for the thin barrier layers 307a and 307b include, for instance, titanium nitride (TiN), tantalum nitride (TaN), tungsten nitride (WN), molybdenum nitride (MoN), tantalum cobalt (TaCo), cobalt tungsten (CoW), tantalum (Ta), ruthenium/tantalum alloy (Ru/Ta), and/or other suitable conductive barrier and liner materials. Note that the barrier layers 307a and 307b need not be the same material. The thickness of the barrier layers 307a and 307b can vary from one embodiment to the next, but in some example configurations the barrier layers 307a and 307b have a relatively uniform thickness in range of 0.5 nm to 8 nm, although other configurations may be thicker or narrower, depending on the desired electrical performance. Furthermore, the thickness need not be perfectly uniform and may vary depending on the deposition process used. A uniform deposition may have a small variance in thickness over the length of the conformal barrier layer, such as the thinnest part of the layer is within 10% of the thickest part of the layer, in accordance with an embodiment. Other embodiments may have a tighter tolerance on the barrier layer thickness, such as a 5% or 2% tolerance between the thinnest and thickest parts. Example deposition techniques that can be used to provide the thin barrier layer 307a include, for instance, atomic layer deposition (ALD), chemical vapor deposition (CVD), self-assembled monolayer (SAM), and electroless deposition. Example deposition techniques that can be used to provide the thin barrier layer 307b include, for instance, ALD, CVD, and, depending on the aspect ratio, physical vapor deposition (PVD). As previously explained, the thin barrier layer 307a on the upper trench walls is removed after the first metal 311a recess and before the barrier layer 307b is provided. The barrier layer 307b effectively provides the diffusion barrier of the interconnect.

Example materials that can be used for the first metal fill 311a and the second metal 311b include, for instance, silver (Ag), aluminum (Al), gold (Au), cobalt (Co), nickel (Ni), tungsten (W), copper (Cu), platinum (Pt), palladium (Pd), and/or other suitably conductive metals. As previously explained, in one embodiment, metal 311a can be the same as metal 311b. However, the techniques provided herein are particularly well-suited to synergize the good or otherwise beneficial fill properties of the first metal 311a for the lower via fill and the good resistance and reliability of the second metal 311b for the upper line. As will be appreciated in light of this disclosure, the difference in relative diffusion coefficient of two different metals into each other may lead to intermix and void formation (Kirkendall porosity). Hence, the use of the first and second conformal barrier layers 307a and 307b. Example deposition techniques that can be used to provide the first fill metal 311a include, for instance, CVD, and, depending on the aspect ratio of the vias, electroplating. Example deposition techniques that can be used to provide the second fill metal 311b include, for instance, CVD, PVD, and electroplating. Example techniques that can be used to recess the first fill metal 311a include both wet and dry etch techniques. Example wet etch techniques include, for instance, hydrogen peroxide, ammonium persulfate, ammonium cerium nitrate, and/or other suitable wet etch techniques. Example dry etch techniques include, for instance, tetrafluoromethane, silicon tetrachloride, chlorine gas, and/or other suitable dry etch techniques. Similar wet and dry etch techniques can be used to etch the second fill metal 311b. Alternatively, a chemical-mechanical planarization (CMP) process can be used.

Figure 4A:
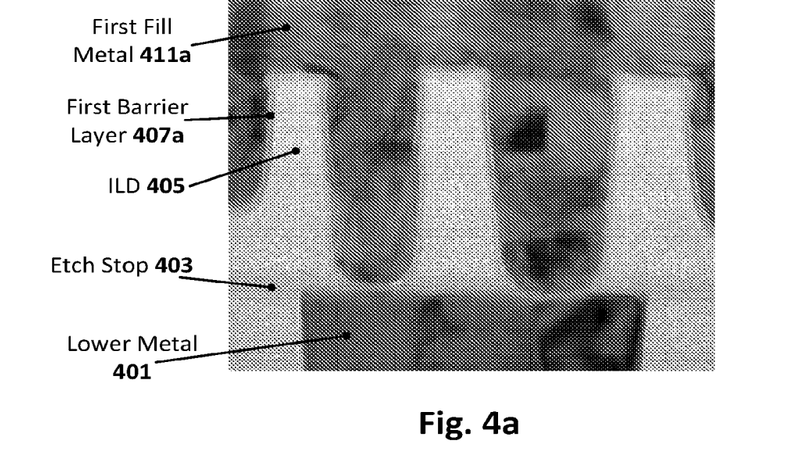
FIGS. 4a-b show transmission electron microscope (TEM) images of structures resulting from a decoupled via process, in accordance with an embodiment of the present disclosure.
Figure 4B:
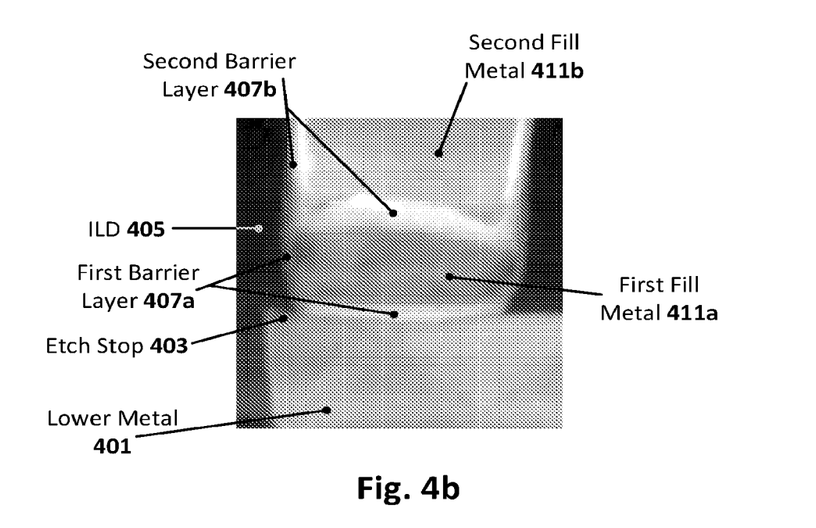

FIGS. 4a-b show transmission electron microscope (TEM) images of structures resulting from a decoupled via process, in accordance with an embodiment of the present disclosure. As can be seen, FIG. 4a generally corresponds to an actual implementation of the intermediate structure shown in FIG. 3a, and FIG. 4b generally corresponds to an actual implementation of the intermediate structure shown in FIG. 3b. To this end, the previous relevant discussion with respect to materials and forming techniques is equally applicable here, as will be appreciated.

As can be seen in FIG. 4a, the structure includes a lower metal 401 having an etch stop layer 403 deposited thereon. An ILD layer 405 is provisioned on the etch stop layer 403. A trench is subsequently etched into the ILD layer 405 down to the etch stop layer, so as to allow for a conductive interconnect from some upper metal layer and the lower metal 401. In more detail, and as can be further seen in FIG. 4a, a first barrier layer 407a is conformally deposited onto the bottom and sidewalls of the trench. Then, the first fill metal 411a is blanket deposited into the trench.

As can be further seen, the non-selective deposition provides excess metal 411a on the field outside the trench as well. As such, the first metal 411a is subsequently recessed so that only a portion of the trench is filled with the first metal 411a, as shown in FIG. 4b. Note that the previously deposited first barrier layer 407a is removed along with the first metal 411a, thereby re-exposing the upper sidewalls of the trench. Then, and as can be further seen in FIG. 4b, a second barrier layer 407b is conformally deposited onto the top of the first metal 411a and the now exposed sidewalls of the trench. Then, the second fill metal 411b is blanket deposited into the remaining trench. Just as with the non-selective deposition of first metal 411a, the non-selective deposition of second metal 411b may provide excess metal 411a on the field outside the trench, which can be removed with planarization and/or etching as previously explained. Subsequent processing can then be carried out.

The thin conformal barrier 407a prevents intermixing between the lower metal 401 and the first metal 411a. In addition, the non-selective deposition of the first metal 411a prevents defects formed in traditional electro-less approaches. Likewise, cladding the top of metal 411a with thin conformal barrier 407b prevents intermixing between the first metal 411a and the second metal 411b, and further minimizes voids and offers higher EM performance. Thus, a methodology for filling high aspect ratio vias using a dual metal process is provided. Note, however, that the first and second metals 411a and 411b may also be the same, in some embodiments.

Thus, as can be seen, cross-sectional TEM or other suitable imaging techniques such as energy-dispersive X-ray spectroscopy can be used to identify materials and barriers around the via portion (first fill metal 411a). The TEM data shows good gap fill with lack of seam. In addition, via resistance is comparable to a traditional tantalum copper stack.

Methodology

Figure 5:
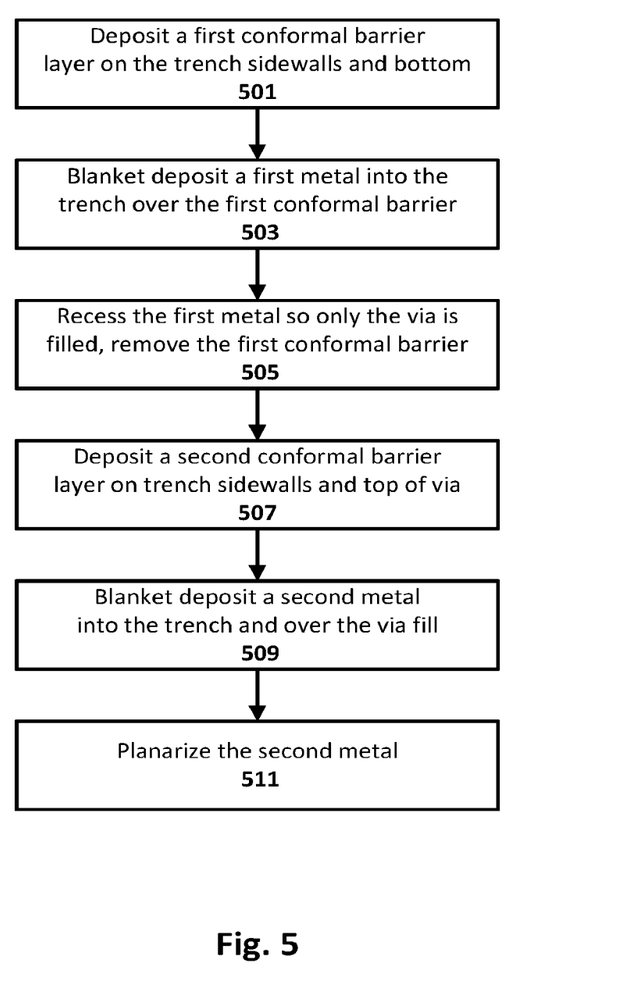
FIG. 5 illustrates a decoupled via fill process, in accordance with an embodiment of the present disclosure.

FIG. 5 illustrates a decoupled via fill process, in accordance with an embodiment of the present disclosure. The method can be carried out, for example, using the various techniques referred to with respect to FIGS. 3a-b. The method presumes an ILD structure having a trench formed therein over some lower metal feature. So, the method includes depositing 501 a first conformal barrier layer on the trench sidewalls and bottom (such as first barrier layer 307a or 407a). The method continues with blanket depositing 503 a first metal into the trench over the first conformal barrier layer, and then recessing 505 the first metal so only the lower via portion of the trench is filled (e.g., first metal fill 311a or 411a). As previously explained, this recessing process also removes the first conformal barrier layer from the upper sidewalls of the trench as the first metal is etched away. The method continues with depositing 507 a second conformal barrier layer on the now exposed trench sidewalls and top of the via formed of the first metal fill (e.g., second barrier layer 307b or 407b). The method continues with blanket depositing 509 a second metal into the trench and over the via fill (e.g., second metal fill 311b or 411b), and planarizing 511 the second metal. The method may then continue with subsequent processing, such as the provisioning of another ILD layer with one or more metal features therein or a device layer.

Figure 6:
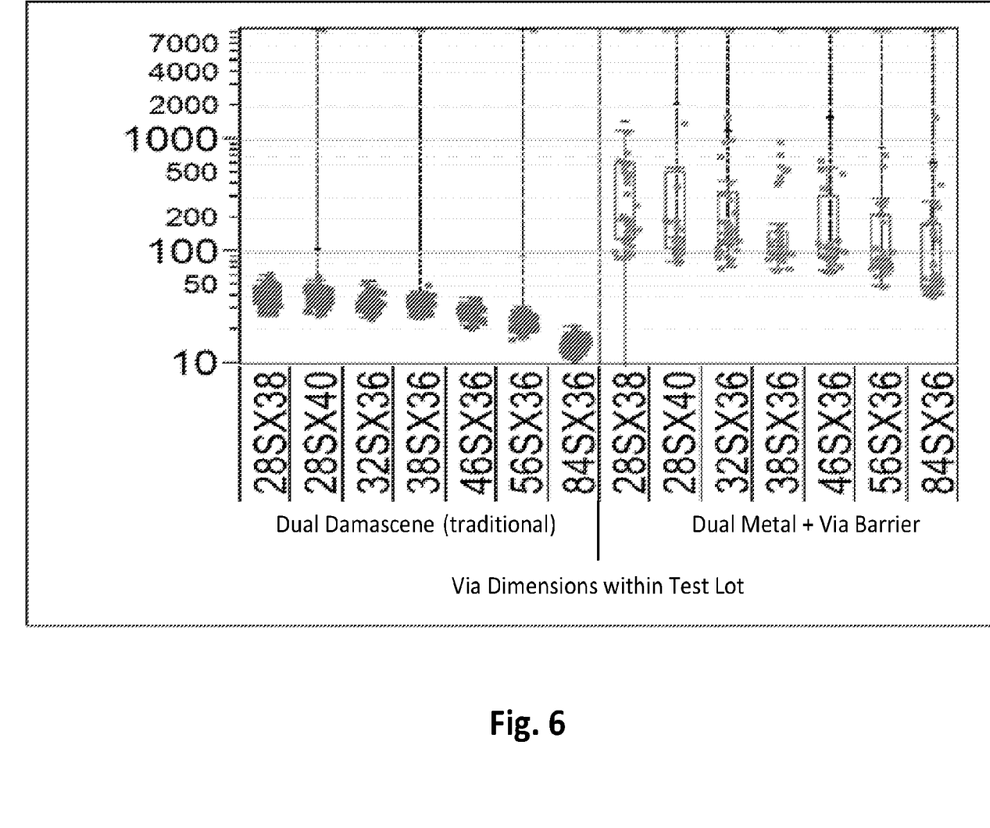
FIG. 6 illustrates a plot of via resistance as a function of via geometry for vias formed by a traditional dual damascene process, and vias formed by a decoupled via fill process in accordance with an embodiment of the present disclosure.

FIG. 6 illustrates a plot of via resistance as a function of via geometry for vias formed by a traditional dual damascene process, and vias formed by a decoupled via fill process in accordance with an embodiment of the present disclosure. As can be seen, the via resistance of dual metal and via barrier approach as provided herein is reasonably comparable, albeit slightly higher, to classic dual damascene as a function of dimension. However, the classic configuration will not have the synergy between the good or otherwise beneficial fill properties of the first metal for the lower via fill and the good resistance and reliability of the second metal for the upper trench or line. Thus, a trade-off can be made between slightly higher via resistance for better via fill, for example.

As will be appreciated in light of this disclosure, extending non-conformal deposition beyond 28 nm tech node will likely be problematic for reasons such as pinch-off and inadequate barrier thickness. The techniques described herein provide a solution that reduces such defects and allows for filling high aspect ratio features using high purity metals. As will be further appreciated, the techniques enable non-selective deposition of metal to fill high aspect ratio vias that land on a different metal while still maintaining low defects. Thus, pinch-off and via opening risk are reduced by using the non-selective deposition of metal in conjunction with conformal barrier deposition between the metal and the landing via. Such an approach provides solutions to high aspect ratio gap fill, while maintaining low resistivity and improving EM capabilities. High aspect ratios that can be filled with the techniques included herein include, for example, 1:4, 1:5, 1:6, 1:7, 1:8, 1:9, 1:10, 1:11, 1:12, and higher. The trench is effectively divided into two (or more) sections, so a non-selective fill and etch process can be used to cover the bottom of the deep trench without incurring problems associated with selective deposition techniques.

Example System

Figure 7:
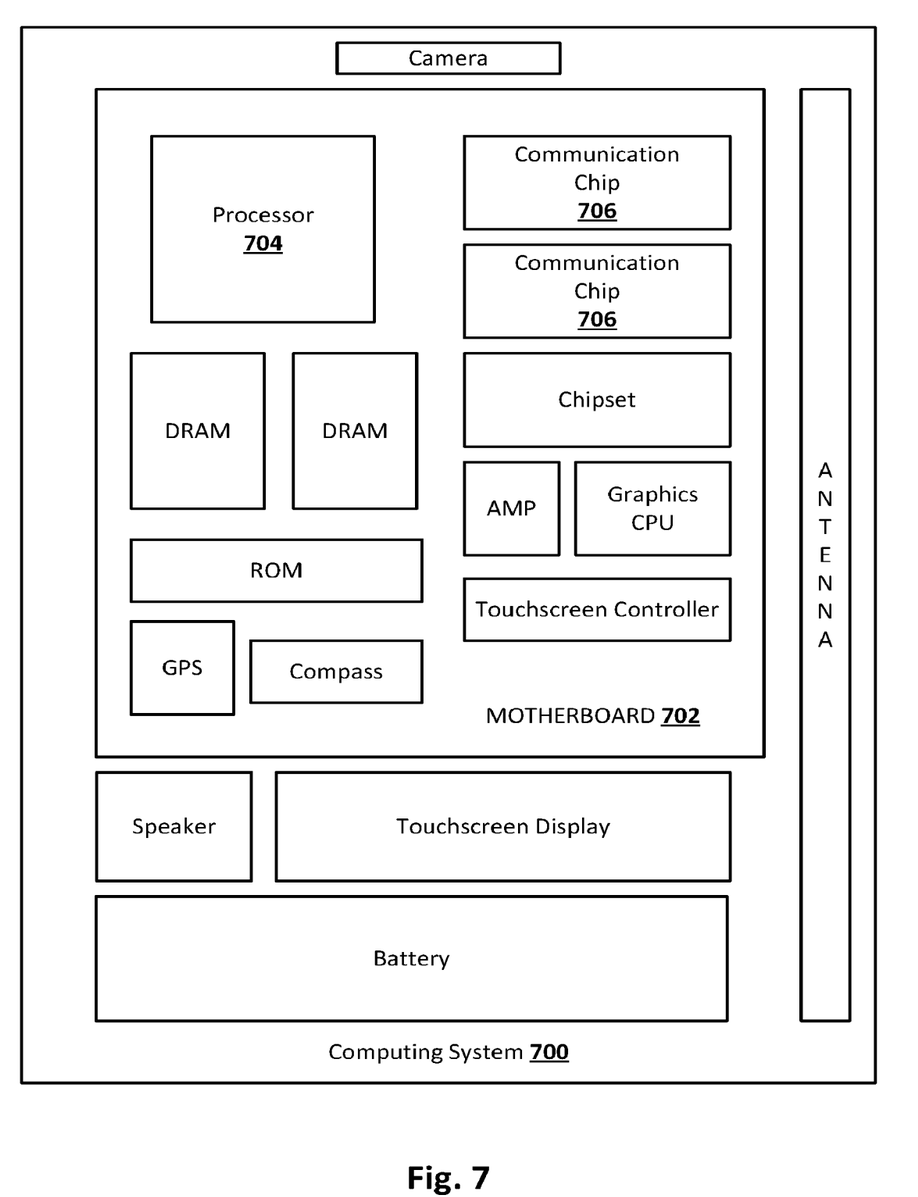
FIG. 7 illustrates a computing system implemented with one or more integrated circuits comprising interconnect structures configured in accordance with an embodiment of the present disclosure.

FIG. 7 illustrates a computing system 700 implemented with one or more integrated circuits comprising interconnect structures configured and/or otherwise fabricated in accordance with an example embodiment of the present disclosure. As can be seen, the computing system 700 houses a motherboard 702. The motherboard 702 may include a number of components, including but not limited to a processor 704 and at least one communication chip 706, each of which can be physically and electrically coupled to the motherboard 702, or otherwise integrated therein. As will be appreciated, the motherboard 702 may be, for example, any printed circuit board, whether a main board or a daughterboard mounted on a main board or the only board of system 700, etc. Depending on its applications, computing system 700 may include one or more other components that may or may not be physically and electrically coupled to the motherboard 702. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 700 may include one or more integrated circuit structures configured with one or more conductive interconnect features as variously described herein, such as an interconnect having a dual metal and via barrier configuration. These integrated circuit structures can be used, for instance, to implement an on-board processor cache or memory array or other circuit feature that includes interconnects. In some embodiments, multiple functions can be integrated into one or more chips (e.g., for instance, note that the communication chip 706 can be part of or otherwise integrated into the processor 704).

The communication chip 706 enables wireless communications for the transfer of data to and from the computing system 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing system 700 includes an integrated circuit die packaged within the processor 704. In some embodiments of the present disclosure, the integrated circuit die of the processor includes onboard memory circuitry that is implemented with one or more integrated circuit structures configured with one or more conductive interconnect features as variously described herein. The term "processor" may refer to any device or portion of a device that processes, for instance, electronic data from registers and/or memory to transform that electronic data into other electronic data that may be stored in registers and/or memory.

The communication chip 706 may also include an integrated circuit die packaged within the communication chip 706. In accordance with some such example embodiments, the integrated circuit die of the communication chip includes one or more devices implemented with one or more integrated circuit structures formed as variously described herein (e.g., interconnect having a dual metal and via barrier configuration). As will be appreciated in light of this disclosure, note that multi-standard wireless capability may be integrated directly into the processor 704 (e.g., where functionality of any chips 706 is integrated into processor 704, rather than having separate communication chips). Further note that processor 704 may be a chip set having such wireless capability. In short, any number of processors 704 and/or communication chips 706 can be used. Likewise, any one chip or chip set can have multiple functions integrated therein.

In various implementations, the computing system 700 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 700 may be any other electronic device that processes data or employs integrated circuit features configured with one or more conductive interconnect features, as variously described herein.

FURTHER EXAMPLE EMBODIMENTS

The following examples pertain to further embodiments, from which numerous permutations and configurations will be apparent.

Example 1 is an integrated circuit device. The device includes an interlayer dielectric (ILD) layer having a trench formed therein, the trench having sidewalls and a bottom that at least partially lands on a lower metal. The device further includes a first conformal barrier layer on the bottom and at least part of the sidewalls of the trench, and a first metal partially filling the trench and in direct contact with the first barrier layer at the bottom of the trench, the first metal having a top surface. The device further includes a second conformal barrier layer on the top surface of the first metal and at least part of the sidewalls of the trench, thereby defining an upper portion of the trench. The device further includes a second metal filling the upper portion of the trench.

Example 2 includes the subject matter of Example 1, further comprising at least one of: another ILD layer over the second metal filling; a passivation layer over the second metal filling; an electronic device layer over the second metal filling; and a contact layer over the second metal filling.

Example 3 includes the subject matter of Example 1 or 2, wherein the first and second conformal barrier layers are implemented with the same conductive material.

Example 4 includes the subject matter of Example 1 or 2, wherein the first and second conformal barrier layers are implemented with different conductive materials.

Example 5 includes the subject matter of any of the previous Examples, wherein the first and second conformal barrier layers are implemented with at least one of titanium nitride (TiN), tantalum nitride (TaN), tungsten nitride (WN), molybdenum nitride (MoN), tantalum cobalt (TaCo), cobalt tungsten (CoW), tantalum (Ta), and ruthenium/tantalum alloy (Ru/Ta). Note the first and second barrier layers need not be the same, but can be.

Example 6 includes the subject matter of any of the previous Examples, wherein the first and second conformal barrier layers each have a thickness in the range of 0.5 nm to 8 nm.

Example 7 includes the subject matter of any of the previous Examples, wherein the thickness of the first and second conformal barrier layers is uniform, such that the thinnest part of each layer is within 5% of the thickest part of that layer.

Example 8 includes the subject matter of any of the previous Examples, wherein the second conformal barrier layer provides a diffusion barrier that prevents the second metal from diffusing into the ILD layer.

Example 9 includes the subject matter of any of the previous Examples, wherein the first and second metals are implemented with the same conductive material.

Example 10 includes the subject matter of any of Examples 1-8, wherein the first and second metals are implemented with different conductive materials.

Example 11 includes the subject matter of any of the previous Examples, wherein the first and second metals are implemented with at least one of silver (Ag), aluminum (Al), gold (Au), cobalt (Co), nickel (Ni), tungsten (W), copper (Cu), platinum (Pt), and palladium (Pd). Note the first and second metals need not be the same, but can be.

Example 12 includes the subject matter of any of the previous Examples, wherein the trench is a dual damascene trench having a lower via portion containing the first metal and an upper trench portion containing the second metal.

Example 13 is a mobile computing system comprising the device of any of Examples 1-12.

Example 14 includes the subject matter of Example 13, wherein the system is a smartphone or tablet computer. Other mobile computing devices will be apparent, such as wearable computing systems (e.g., glasses, bracelets, watches, fabrics). In still other embodiments, the computing system need not be mobile and may be, for instance, a work station or set-top box or desktop computer or game console. In a more general sense, the interconnect structures provided herein can be used in any electronic device of any kind.

Example 15 is a memory comprising the device of any of Examples 1-12. The memory may be volatile or non-volatile memory, and may be a standalone memory device or an integrated memory device (such as on-board cache or embedded memory).

Example 16 is a processor comprising the device of any of Examples 1-12. The processor may be, for example, a central processing unit, graphics processor, co-processor, video processor, or microcontroller. Any such processing environments can employ the various interconnect structures provided herein.

Example 17 is communication chip comprising the device of any of Examples 1-12. The communication chip may be, for example, a Wi-Fi chip or chip set or a network interface chip for wired or wireless communication links. Any such wired or wireless communication devices can employ the various interconnect structures provided herein.

Example 18 is an integrated circuit device. The device includes an interlayer dielectric (ILD) layer having a trench formed therein, the trench having sidewalls and a bottom that at least partially lands on a lower metal. The device further includes a first conformal conductive barrier layer on the bottom and at least part of the sidewalls of the trench, and a first metal partially filling the trench and in direct contact with the first barrier layer at the bottom of the trench, the first metal having a top surface. The device further includes a second conformal conductive barrier layer on the top surface of the first metal and at least part of the sidewalls of the trench, thereby defining an upper portion of the trench. The device further includes a second metal filling the upper portion of the trench, wherein the first metal is different than the second metal. Thus, a dual metal structure is provided, which in some embodiments is configured to exploit fill properties of the first metal and good resistance and reliability of the second metal. Numerous such configurations will be apparent in light of this disclosure.

Example 19 includes the subject matter of Example 18, wherein the first and second conformal barrier layers are implemented with different conductive materials.

Example 20 includes the subject matter of Example 18 or 19, wherein the first and second conformal barrier layers each have a thickness in the range of 0.5 nm to 8 nm.

Example 21 is a method for forming an integrated circuit device. The method includes forming an interlayer dielectric (ILD) layer having a trench formed therein, the trench having sidewalls and a bottom that at least partially lands on a lower metal. The method further includes depositing a first conformal barrier layer on the bottom and at least part of the sidewalls of the trench, and non-selectively depositing a first metal to fill the trench, so that the first metal is in direct contact with the first barrier layer at the bottom of the trench. The method continues with recessing the first metal into the trench, thereby leaving the first metal with a top surface within the trench and re-exposing upper sidewalls of the trench. The method further includes depositing a second conformal barrier layer on the top surface of the first metal and the upper sidewalls of the trench, thereby defining an upper portion of the trench. The method continues with non-selectively depositing a second metal to fill the upper portion of the trench.

Example 22 includes the subject matter of Example 21, and further includes at least one of: planarizing the second metal; forming another ILD layer over the second metal filling; depositing a passivation layer over the second metal filling; forming an electronic device layer over the second metal filling; and forming a contact layer over the second metal filling.

Example 23 includes the subject matter of Example 21 or 22, wherein the first and second conformal barrier layers are implemented with the same conductive material.

Example 24 includes the subject matter of Example 21 or 22, wherein the first and second conformal barrier layers are implemented with different conductive materials.

Example 25 includes the subject matter of any of Examples 21-24, wherein the first and second conformal barrier layers are implemented with at least one of titanium nitride (TiN), tantalum nitride (TaN), tungsten nitride (WN), molybdenum nitride (MoN), tantalum cobalt (TaCo), cobalt tungsten (CoW), tantalum (Ta), and ruthenium/tantalum alloy (Ru/Ta).

Example 26 includes the subject matter of any of Examples 21-25, wherein the first and second conformal barrier layers each have a thickness in the range of 0.5 nm to 8 nm.

Example 27 includes the subject matter of any of Examples 21-26, wherein the thickness of the first and second conformal barrier layers is uniform, such that the thinnest part of each layer is within 5% of the thickest part of that layer.

Example 28 includes the subject matter of any of Examples 21-27, wherein the second conformal barrier layer provides a diffusion barrier that prevents the second metal from diffusing into the ILD layer.

Example 29 includes the subject matter of any of Examples 21-28, wherein the first and second metals are implemented with the same conductive material.

Example 30 includes the subject matter of any of Examples 21-28, wherein the first and second metals are implemented with different conductive materials.

Example 31 includes the subject matter of any of Examples 21-30, wherein the first and second metals are implemented with at least one of silver (Ag), aluminum (Al), gold (Au), cobalt (Co), nickel (Ni), tungsten (W), copper (Cu), platinum (Pt), and palladium (Pd).

Example 32 includes the subject matter of any of Examples 21-31, wherein the trench is a dual damascene trench having a lower via portion containing the first metal and an upper trench portion containing the second metal.

Example 33 includes the subject matter of any of Examples 21-32, wherein depositing the first conformal barrier layer comprises at least one of atomic layer deposition (ALD), chemical vapor deposition (CVD), self-assembled monolayer (SAM), and electroless deposition.

Example 34 includes the subject matter of any of Examples 21-33, wherein depositing the second conformal barrier layer comprises at least one of atomic layer deposition (ALD), chemical vapor deposition (CVD), and physical vapor deposition (PVD).

Example 35 includes the subject matter of any of Examples 21-34, wherein non-selectively depositing the first metal comprises at least one of chemical vapor deposition (CVD) and electroplating.

Example 36 includes the subject matter of any of Examples 21-35, wherein non-selectively depositing the second metal comprises at least one of chemical vapor deposition (CVD), physical vapor deposition (PVD) and electroplating.

Example 37 includes the subject matter of any of Examples 21-36, wherein recessing the first metal into the trench comprises at least one of wet and dry etch techniques.

Example 38 includes the subject matter of any of Examples 21-37, wherein recessing the first metal into the trench comprises at least one wet etch technique that uses at least one of hydrogen peroxide, ammonium persulfate and ammonium cerium nitrate.

Example 39 includes the subject matter of any of Examples 21-38, wherein recessing the first metal into the trench comprises at least one dry etch technique that uses at least one of tetrafluoromethane, silicon tetrachloride, and chlorine gas.

Example 40 includes the subject matter of any of Examples 21-39, and further includes planarizing the second metal using a chemical-mechanical planarization (CMP) process.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit structure, comprising:
a first dielectric layer;
a second dielectric layer on the first dielectric layer;
a trench in the first dielectric layer and in the second dielectric layer, the trench having a lower portion with sidewalls and an upper portion with sidewalls;
a first barrier layer along and in contact with the sidewalls of the lower portion of the trench, the first barrier layer in contact with the first dielectric layer and in contact with the second dielectric layer, and the first barrier layer having a first barrier layer composition;
a first fill material on the first barrier layer in the lower portion of the trench, the first fill material having a first fill material composition;
a second barrier layer along and in contact with the sidewalls of the upper portion of the trench, the second barrier layer further on the first fill material, the second barrier layer in contact with the second dielectric layer but not in contact with the first dielectric layer, and the second barrier layer having a second barrier layer composition; and
a second fill material in the upper portion of the trench, the second fill material having a second fill material composition different from the first fill material composition.

2. The integrated circuit structure of claim 1, wherein the second barrier layer composition is different from the first barrier layer composition.

3. The integrated circuit structure of claim 1, wherein the first barrier layer comprises titanium nitride.

4. The integrated circuit structure of claim 1, wherein the second barrier layer comprises titanium nitride.

5. The integrated circuit structure of claim 1, wherein the first barrier layer comprises titanium nitride, and wherein the second barrier layer comprises titanium nitride.

6. The integrated circuit structure of claim 1, wherein the first fill material comprises cobalt.

7. The integrated circuit structure of claim 1, wherein the second fill material comprises tungsten.

8. The integrated circuit structure of claim 1, wherein the first fill material comprises cobalt, and wherein the second fill material comprises tungsten.

9. The integrated circuit structure of claim 1, wherein the second barrier layer has a top surface co-planar with a top surface of the second dielectric layer.

10. The integrated circuit structure of claim 1, wherein the sidewalls of the trench are substantially vertical.

11. A computing device, comprising:
a board; and
a component coupled to the board, the component including an integrated circuit structure, comprising:
   a first dielectric layer;
   a second dielectric layer on the first dielectric layer;
   a trench in the first dielectric layer and in the second dielectric layer, the trench having a lower portion with sidewalls and an upper portion with sidewalls;
   a first barrier layer along and in contact with the sidewalls of the lower portion of the trench, the first barrier layer in contact with the first dielectric layer and in contact with the second dielectric layer, and the first barrier layer having a first barrier layer composition;
   a first fill material on the first barrier layer in the lower portion of the trench, the first fill material having a first fill material composition;
   a second barrier layer along and in contact with the sidewalls of the upper portion of the trench, the second barrier layer further on the first fill material, the second barrier layer in contact with the second dielectric layer but not in contact with the first dielectric layer, and the second barrier layer having a second barrier layer composition; and
   a second fill material in the upper portion of the trench, the second fill material having a second fill material composition different from the first fill material composition.

12. The computing device of claim 11, further comprising:
   a memory coupled to the board.

13. The computing device of claim 11, further comprising:
   a communication chip coupled to the board.

14. The computing device of claim 11, further comprising:
   a memory coupled to the board; and
   a communication chip coupled to the board.

15. The computing device of claim 11, further comprising:
   a camera coupled to the board.

16. The computing device of claim 11, further comprising:
   a battery coupled to the board.

17. The computing device of claim 11, further comprising:
   an antenna coupled to the board.

18. The computing device of claim 11, wherein the component is a packaged integrated circuit die.

19. The computing device of claim 11, wherein the component is selected from the group consisting of a processor, a communications chip, and a digital signal processor.

20. The computing device of claim 11, wherein the computing device is selected from the group consisting of a mobile phone, a laptop, a desk top computer, a server, and a set-top box.

* * * * *